(12) United States Patent
Lu et al.

(10) Patent No.: US 11,239,308 B2
(45) Date of Patent: Feb. 1, 2022

(54) CAPACITOR AND METHOD FOR PRODUCING CAPACITOR

(71) Applicant: SHENZHEN GOODIX TECHNOLOGY CO., LTD., Shenzhen (CN)

(72) Inventors: Bin Lu, Shenzhen (CN); Jian Shen, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/022,225

(22) Filed: Sep. 16, 2020

(65) Prior Publication Data

US 2021/0005705 A1   Jan. 7, 2021

Related U.S. Application Data

(63) Continuation of application No. PCT/CN2018/123575, filed on Dec. 25, 2018.

(51) Int. Cl.
*H01L 49/02* (2006.01)
*H01L 23/522* (2006.01)
(Continued)

(52) U.S. Cl.
CPC ............. *H01L 28/75* (2013.01); *H01G 4/005* (2013.01); *H01G 4/228* (2013.01); *H01G 4/232* (2013.01);
(Continued)

(58) Field of Classification Search
CPC ......... H01L 28/75; H01L 28/91; H01L 28/92; H01L 23/5222; H01L 27/11597; H01G 4/005; H01G 4/232; H01G 4/228
See application file for complete search history.

(56) References Cited

U.S. PATENT DOCUMENTS 8,085,524 B2   12/2011   Roozeboom et al.
8,405,135 B2    3/2013   Yang et al.
(Continued)

FOREIGN PATENT DOCUMENTS

CN   101341576 B   5/2012
CN   103155098 A   6/2013
(Continued)

*Primary Examiner* — Jose R Diaz

(57) ABSTRACT

Embodiments of the present application disclose a capacitor and a method for producing a capacitor. The capacitor includes: an electrode layer including a first electrode and a second electrode separated from each other; a laminated structure including n dielectric layer(s) and n+1 conductive layers, where the n dielectric layer(s) and the n+1 conductive layers form a structure that a conductive layer and a dielectric layer are adjacent to each other, and the laminated structure forms at least two columnar structures, and n is a positive integer; and an interconnection structure configured to electrically connect an odd-numbered conductive layer in the n+1 conductive layers to the first electrode and electrically connect an even-numbered conductive layer in the n+1 conductive layers to the second electrode. According to the technical solution of the embodiments of the present application, capacitance density of the capacitor could be improved.

18 Claims, 9 Drawing Sheets

(51) Int. Cl.
*H01G 4/232* (2006.01)
*H01G 4/005* (2006.01)
*H01G 4/228* (2006.01)

(52) U.S. Cl.
CPC .......... *H01L 23/5222* (2013.01); *H01L 28/91* (2013.01); *H01L 28/92* (2013.01)

(56) References Cited

U.S. PATENT DOCUMENTS

| | | |
|---|---|---|
| 8,962,423 B2 | 2/2015 | Cheng et al. |
| 9,105,759 B2 | 8/2015 | Chou et al. |
| 9,224,796 B2 | 12/2015 | Colonna et al. |
| 9,397,152 B2 | 7/2016 | Cheng et al. |
| 10,164,005 B2 | 12/2018 | Tsui et al. |
| 2012/0080771 A1 | 4/2012 | Yang et al. |
| 2012/0267773 A1 | 10/2012 | Ebefors et al. |
| 2013/0181326 A1 | 7/2013 | Cheng et al. |
| 2014/0015102 A1 | 1/2014 | Bar et al. |
| 2014/0367828 A1 | 12/2014 | Colonna et al. |
| 2016/0122180 A1 | 5/2016 | Ebefors et al. |
| 2017/0271436 A1 | 9/2017 | Tsui et al. |
| 2019/0103227 A1* | 4/2019 | Lu .......................... H01L 28/91 |

FOREIGN PATENT DOCUMENTS

| | | |
|---|---|---|
| CN | 107204323 A | 9/2017 |
| CN | 107359153 A | 11/2017 |
| WO | WO2010059118 A1 | 5/2010 |

* cited by examiner

CAPACITOR AND METHOD FOR PRODUCING CAPACITOR

CROSS REFERENCE TO RELATED APPLICATIONS

The present application is a continuation of international application No. PCT/CN2018/123575, filed on Dec. 25, 2018, which is hereby incorporated by reference in its entirety.

TECHNICAL FIELD

Embodiments of the present application relate to the field of capacitors, and more in particular, to a capacitor and a method for producing a capacitor.

BACKGROUND

A capacitor is an important electronic component. With the continuous development of modern electronic system towards multi-function, high integration, low power consumption and miniaturization, an existing capacitor manufacturing technology has been unable to meet diversified needs of various high-end applications.

A wafer-level three-dimensional (3D) capacitor is a new type of capacitor manufactured on a silicon wafer by utilizing a semiconductor processing technology in recent years. Compared with a commonly used multilayer ceramic capacitor, the wafer-level three-dimensional capacitor has significant advantages in terms of minimum thickness, frequency response, and temperature coefficient of a chip. The wafer-level 3D capacitor has a wide range of applications in consumer electronics that require an extremely small size of a device, or in medical, vehicle-mounted devices, aerospace electronics fields that require strict device performance and reliability.

However, at present, capacitance density of the wafer-level 3D capacitor is still limited, and how to improve the capacitance density of the capacitor has become an urgent technical problem to be resolved.

SUMMARY

Embodiments of the present application provide a capacitor and a method for producing a capacitor, which could improve capacitance density of the capacitor.

According to a first aspect, provided is a capacitor, including: an electrode layer including a first electrode and a second electrode separated from each other; a laminated structure including n dielectric layer(s) and n+1 conductive layers, where the n dielectric layer(s) and the n+1 conductive layers form a structure that a conductive layer and a dielectric layer are adjacent to each other, and the laminated structure forms at least two columnar structures, and n is a positive integer; and an interconnection structure configured to electrically connect an odd-numbered conductive layer in the n+1 conductive layers to the first electrode and electrically connect an even-numbered conductive layer in the n+1 conductive layers to the second electrode.

According to the capacitor of the embodiments of the application, a laminated structure that a conductive layer and a dielectric layer are alternately stacked is adopted, and a plurality of columnar structures are provided, so that a larger capacitance value may be obtained under the condition of a smaller device size, and thus capacitance density of the capacitor could be improved.

In some possible implementations, the at least two columnar structures include at least one first columnar structure and at least one second columnar structure, where a size of the first columnar structure is greater than that of the second columnar structure.

In some possible implementations, the at least two columnar structures include one first columnar structure and at least two second columnar structures.

By adopting a large-sized first columnar structure and a plurality of small-sized second columnar structures, it not only facilitates arrangement of an interconnection structure but also could improve the capacitance density to a great extent.

In some possible implementations, a depth-to-width ratio of the second columnar structure is greater than a predetermined threshold value. For example, the predetermined threshold value may be 10; and the depth-to-width ratio of the second columnar structure may be 30.

In some possible implementations, the interconnection structure is connected to the n+1 conductive layers at a top end of the first columnar structure.

In some possible implementations, the interconnection structure is connected to the n+1 conductive layers at a top end of the first columnar structure and under the laminated structure. In this way, the interconnection structure provided at the first columnar structure may be reduced, so that the size of the first columnar structure may be reduced, and the capacity density may further be improved.

In some possible implementations, the laminated structure is provided with a step structure, and the interconnection structure is connected to the n+1 conductive layers through the step structure.

In some possible implementations, the columnar structure is a rectangular parallelepiped structure or a cylindrical structure.

In some possible implementations, the capacitor further includes: an insulating layer disposed above and below the laminated structure.

In some possible implementations, the interconnection structure is a conductive through hole that passes through the insulating layer and is respectively connected to the n+1 conductive layers.

In some possible implementations, n is greater than or equal to 5.

According to a second aspect, provided is a method for producing a capacitor, including: producing a plurality of holes or trenches on a substrate to obtain a first structure; producing a first laminated structure on the first structure, where the first laminated structure includes m dielectric layer(s) and m+1 conductive layers, the m dielectric layer(s) and the m+1 conductive layers form a structure that a conductive layer and a dielectric layer are adjacent to each other, and m is a positive integer; producing a first insulating layer on the first laminated structure to obtain a second structure; turning over the second structure; removing the substrate to expose the first laminated structure; producing a second laminated structure on the first laminated structure, where the second laminated structure includes k dielectric layer(s) and k conductive layer(s), the k dielectric layer(s) and the k conductive layer(s) form a structure that a conductive layer and a dielectric layer are adjacent to each other and form, with the first laminated structure, a laminated structure that a conductive layer and a dielectric layer are adjacent to each other, the laminated structure forms a columnar structure at the hole or trench, and k is a positive integer; producing a second insulating layer on the second laminated structure; and producing a first electrode and a second electrode, where the first electrode is electrically connected to an odd-numbered conductive layer among the m+k+1 conductive layers, and the second electrode is electrically connected to an even-numbered conductive layer among the m+k+1 conductive layers.

According to the method for producing the capacitor provided by the embodiments of the present application, a laminated structure including a larger number of conductive layers and dielectric layers may be obtained by producing the laminated structure twice and a capacitance value of the capacitor is increased, and a plurality of holes or trenches are utilized to form a plurality of columnar structures of the laminated structure, which may further increase the capacitance value of the capacitor, thereby improving capacitance density of the capacitor.

In some possible implementations, the plurality of holes or trenches include a first hole or trench and a second hole or trench, and a size of the first hole or trench is greater than that of the second hole or trench.

In some possible implementations, a depth-to-width ratio of the second hole or trench is greater than a predetermined threshold value.

In some possible implementations, before the producing the first laminated structure on the first structure, the method further includes: producing an etching protection layer on the first structure; where the removing the substrate to expose the first laminated structure includes: removing the substrate to expose the etching protection layer, and then removing the etching protection layer to expose the first laminated structure.

In some possible implementations, before the turning over the second structure, the method further includes: grinding a surface of the first insulating layer flat.

In some possible implementations, after the turning over the second structure, the method further includes: bonding the surface of the first insulating layer to a carrier.

In some possible implementations, after the producing the first electrode and the second electrode, the method further includes: thinning the carrier or removing the carrier and a bonding layer.

In some possible implementations, after the producing the second insulating layer on the second laminated structure, the method further includes: grinding a surface of the second insulating layer flat.

In some possible implementations, the surface of the second insulating layer is grinded flat until the conductive layer at the uppermost of the second laminated structure is exposed.

In some possible implementations, before the producing the first electrode and the second electrode, the method further includes: producing a first interconnection structure, where the first interconnection structure includes a conductive through hole respectively connected to all or part of the conductive layers.

In some possible implementations, when the first interconnection structure includes the conductive through hole respectively connected to the all conductive layers, the first electrode is electrically connected to the odd-numbered conductive layer through the first interconnection structure, and the second electrode is electrically connected to the even-numbered conductive layer through the first interconnection structure.

In some possible implementations, when the first interconnection structure includes the conductive through hole respectively connected to the part of the conductive layers, the method further includes: producing a second interconnection structure after the producing the first laminated structure on the first structure; where the first electrode is electrically connected to the odd-numbered conductive layer through the first interconnection structure and the second interconnection structure, and the second electrode is electrically connected to the even-numbered conductive layer through the first interconnection structure.

In some possible implementations, the producing the first interconnection structure includes: etching the second insulating layer at the first hole or trench to form a first step structure to expose the conductive layer to be connected; depositing a first etching stop layer; depositing a third insulating layer on the first etching stop layer, where etching resistance of the first etching stop layer is greater than that of the third insulating layer; for a specific conductive layer, etching the third insulating layer to obtain a hole that passes through the third insulating layer until the first etching stop layer on the first step structure; removing the first etching stop layer in the hole; and depositing metal in the hole to obtain a conductive through hole that passes through the third insulating layer and the first etching stop layer and is connected to the specific conductive layer.

In some possible implementations, the producing the second interconnection structure includes: before the producing the first insulating layer on the first laminated structure, etching the first laminated structure to form a second step structure to expose the conductive layer to be connected; depositing a second etching stop layer, where etching resistance of the second etching stop layer is greater than that of the first insulating layer; after the producing the first insulating layer on the first laminated structure, for a specific conductive layer, etching the first insulating layer to obtain a hole that passes through the first insulating layer until the second etching stop layer on the second step structure; removing the second etching stop layer in the hole; and depositing metal in the hole to obtain a conductive through hole that passes through the first insulating layer and the second etching stop layer and is connected to the specific conductive layer, and forming metal interconnection among the conductive layers to be connected.

In some possible implementations, after the producing the second interconnection structure, the method further includes: producing a fourth insulating layer on the second interconnection structure.

In some possible implementations, the method further includes: obtaining independent capacitors by cutting.

DESCRIPTION OF EMBODIMENTS

Technical solutions in embodiments of the present application will be described hereinafter with reference to the accompanying drawings.

Figure 1:
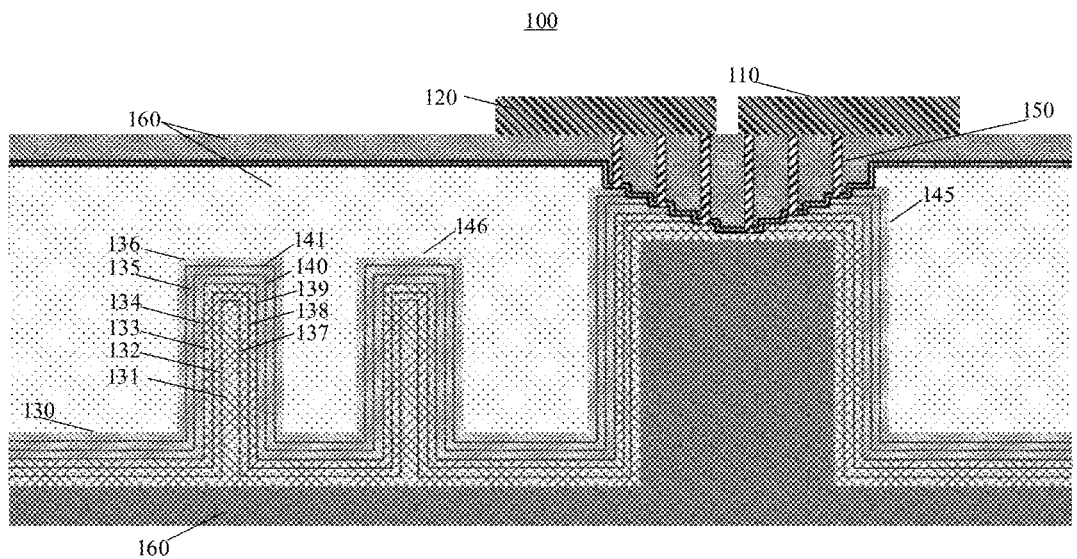
FIG. 1 is a schematic diagram of a capacitor according to an embodiment of the present application.

FIG. 1 illustrates a schematic diagram of a capacitor 100 according to an embodiment of the present application.

The capacitor 100 is a wafer-level 3D capacitor, and FIG. 1 is a cross-sectional view thereof.

As shown in FIG. 1, the capacitor 100 may include a first electrode 110, a second electrode 120, a laminated structure 130 and an interconnection structure 150.

The first electrode 110 and the second electrode 120 are positive and negative electrodes of the capacitor 100. The first electrode 110 and the second electrode 120 are separated from each other to form an electrode layer. The materials of the first electrode 110 and the second electrode 120 may adopt various conductive materials, such as metallic aluminum.

The laminated structure 130 includes n dielectric layer(s) and n+1 conductive layers, and n is a positive integer. Optionally, in one embodiment, n is 5, that is, the laminated structure 130 may include six conductive layers such as conductive layers 131-136 shown in FIG. 1, and five dielectric layers such as dielectric layers 137-141 shown in FIG. 1.

As shown in FIG. 1, the n dielectric layers and the n+1 conductive layers form a structure that a conductive layer and a dielectric layer are adjacent to each other, that is, the laminated structure 130 is a laminated structure that a conductive layer and a dielectric layer are alternately stacked. Since there is one more layer of the conductive layer, the uppermost layer and the lowermost layer of the laminated structure 130 are conductive layers.

In addition, the laminated structure 130 forms at least two columnar structures, such as a first columnar structure 145 and a second columnar structure 146 as shown in FIG. 1.

Optionally, the columnar structure may be a rectangular parallelepiped structure (including a wall structure) or a cylindrical structure.

The existence of the columnar structure is equivalent to increasing a plate area of the capacitor, so it is beneficial to improve the capacitance value of the capacitor.

Optionally, a material of the dielectric layer in the laminated structure 130 may be silicon oxide, silicon nitride, metal oxide, metal nitride, etc., such as silicon dioxide, silicon nitride, or high dielectric constant materials including aluminum oxide, hafnium oxide, zirconium oxide, titanium dioxide, $Y_2O_3$, $La_2O_3$, $HfSiO_4$, $LaAlO_3$, $SrTiO_3$, $LaLuO_3$, etc. It may also be one or a combination of the foregoing materials.

Optionally, a material of the conductive layer in the laminated structure 130 may be heavily doped polysilicon, carbon material, or various metals such as aluminum, tungsten, copper, titanium, tantalum, etc., or compounds with low resistivity such as titanium nitride and tantalum nitride, or a laminated layer or combination of the foregoing conductive materials.

The interconnection structure is configured to electrically connect an odd-numbered conductive layer in the n+1 conductive layers to the first electrode 110 and electrically connect an even-numbered conductive layer in the n+1 conductive layers to the second electrode 120.

It should be understood that in the embodiment of the present application, the order of the conductive layers involved may be from one side to the other side of the laminated structure 130, for example, from top to bottom or from bottom to top. For convenience of description, the following description will take the order from bottom to top as an example. For example, in FIG. 1, the conductive layers 131-136 are the first to the sixth conductive layers, respectively.

As shown in FIG. 1, odd-numbered conductive layers among the conductive layers 131-136, that is, the first, third and fifth conductive layers, are electrically connected to the first electrode 110 through the interconnection structure 150, and even-numbered conductive layers among the conductive layers 131-136, that is, the second, fourth and sixth conductive layers, are electrically connected to the second electrode 120 through the interconnection structure 150.

A material of the interconnection structure 150 may adopt various conductive materials, which may be the same as or different from the material of the conductive layer in the laminated structure 130, for example, titanium nitride and metallic tungsten may be adopted.

Optionally, in an embodiment of the present application, the at least two columnar structures include at least one first columnar structure 145 and at least one second columnar structure 146, where a size of the first columnar structure 145 is greater than that of the second columnar structure 146. In other words, for the capacitor 100, it includes two sizes of columnar structures.

In the embodiment of the present application, the size of the columnar structure may be a width of the columnar structure, that is, the width in the lateral direction in FIG. 1.

For example, the size of the first columnar structure 145 may be 20 microns, and the size of the second columnar structure 146 may be 2 microns, but the embodiment of the present application is not limited thereto.

Optionally, in an embodiment of the present application, as shown in FIG. 1, the at least two columnar structures include one first columnar structure 145 and at least two second columnar structures 146.

Optionally, a depth-to-width ratio of the second columnar structure 146 is greater than a predetermined threshold value. For example, the predetermined threshold value may be 10; and the depth-to-width ratio of the second columnar structure may be 30.

From the perspective of improving the capacitance density, the use of a larger number of small-sized columnar structures with large depth-width ratios could maximize the capacitance density. However, the small-sized columnar structure is not convenient to provide the interconnection structure 150, and therefore a large-sized columnar structure may be used to provide the interconnection structure 150. In other words, by adopting a large-sized first columnar structure 145 and a plurality of small-sized second columnar structures 146, it not only facilitates arrangement of an interconnection structure 150, but also could improve the capacitance density to a great extent.

Optionally, in an embodiment of the present application, as shown in FIG. 1, the interconnection structure 150 is connected to the n+1 conductive layers at a top end of the first columnar structure 145.

Figure 2:
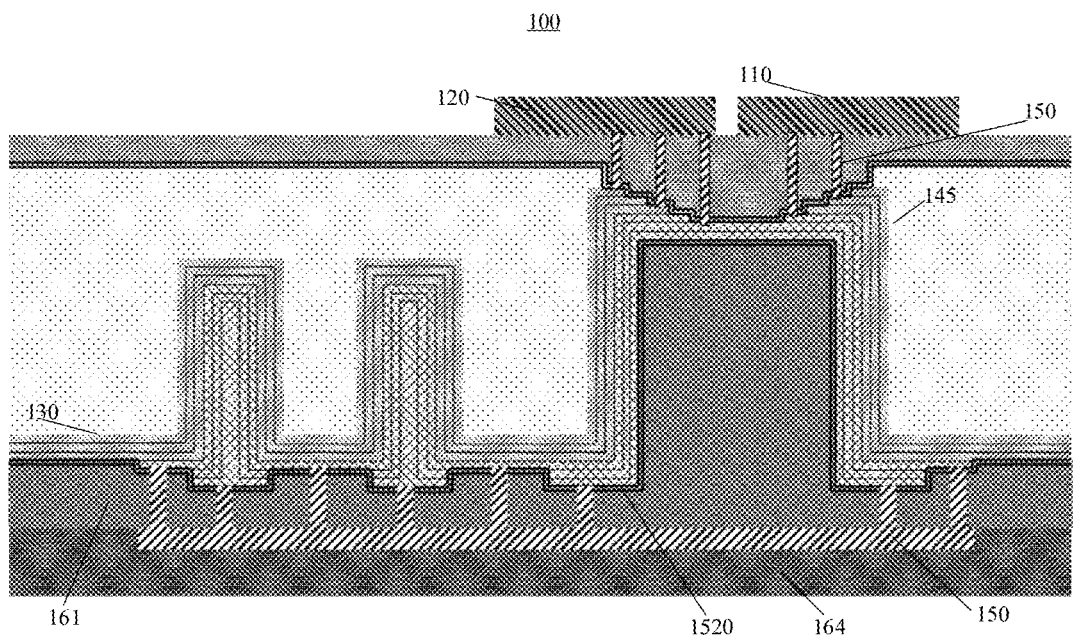
FIG. 2 is a schematic diagram of a capacitor according to another embodiment of the present application.

Optionally, in an embodiment of the present application, as shown in FIG. 2, the interconnection structure 150 is connected to the n+1 conductive layers at a top end of the first columnar structure 145 and under the laminated structure 130.

In the foregoing embodiment, the interconnection structure 150 is only provided at the position of the first columnar structure 145. In this embodiment, part of the interconnection structure 150 may be dispersedly provided below the laminated structure 130. It is easy to implement that some interconnection structures are dispersedly provided below the laminated structure 130, which may reduce the interconnection structure provided at the first columnar structure 145, thereby reducing the size of the first columnar structure 145, and further improving the capacitance density.

It should be understood that, except for the different settings of the interconnection structure 150, the other settings in FIG. 2 and FIG. 1 are the same, details are not described herein for brevity.

As shown in FIGS. 1 and 2, the laminated structure 130 is provided with a step structure, and the interconnection structure 150 is connected to the n+1 conductive layers through the step structure. The arrangement of the step structure facilitates the connection and isolation between different conductive layers.

Optionally, in an embodiment of the present application, as shown in FIGS. 1 and 2, the capacitor 100 may further include:

an insulating layer 160 disposed above and below the laminated structure 130.

It should be understood that to be above and below the laminated structure are relative to the whole laminated structure, that is, to be above the laminated structure means to be above a top layer of the laminated structure, and to be below the laminated structure means to be below a bottom layer of the laminated structure.

In this case, the interconnection structure 150 is a conductive through hole that passes through the insulating layer 160 and is respectively connected to the n+1 conductive layers.

As shown in FIGS. 1 and 2, the electrical connection of the first electrode 110 and the second electrode 120 to the corresponding conductive layers may be realized by providing the conductive through hole in the insulating layer 160.

Optionally, a material of the insulating layer 160 may be an organic polymer material, including polyimide, parylene, benzocyclobutene, etc., it may also be some inorganic materials, including spin on glass (SOG), undoped silicon glass (USG), silicon oxide synthesized by tetraethyl orthosilicate (TEOS), silicon oxide, silicon nitride and ceramic; and it may also be a combination of the foregoing materials.

Figure 3:
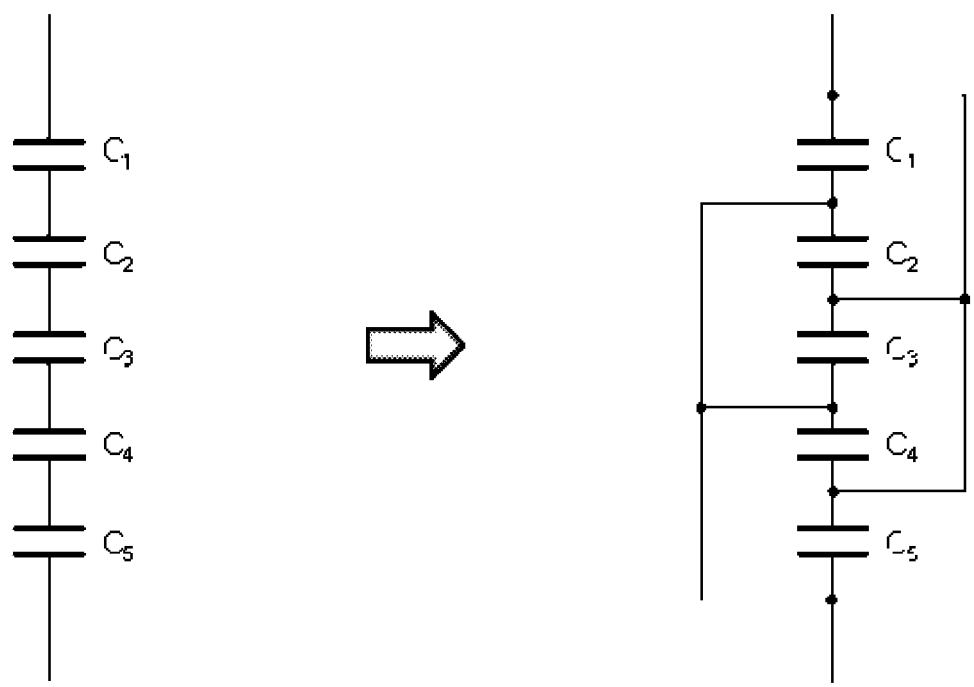
FIG. 3 is an equivalent circuit diagram of a capacitor according to an embodiment of the present application.

FIG. 3 illustrates an equivalent circuit diagram of a capacitor 100 according to an embodiment of the present application.

Taking n being 5 as an example, as shown in FIG. 3, six conductive layers and five dielectric layers that are alternately stacked are equivalent to five capacitors connected in series with each other (each dielectric layer corresponds to one capacitor). After the interconnection structure 150 of the embodiment of the present application is adopted, the five capacitors are connected in parallel to obtain the capacitor 100 of the embodiment of the present application. Therefore, the capacitor 100 of the embodiment of the present application has a larger capacitance value.

According to the capacitor of the embodiments of the application, a laminated structure that a conductive layer and a dielectric layer are alternately stacked is adopted, and a plurality of columnar structures are provided, so that a larger capacitance value may be obtained under the condition of smaller device size, and thus capacitance density of the capacitor could be improved.

The capacitor of the embodiment of the present application are described above, and a method for producing a capacitor of an embodiment of the present application will be described below. The method for producing the capacitor of the embodiment of the present application may prepare the capacitor of the foregoing embodiment of the present application, and the related descriptions in the following embodiment and the foregoing embodiments may be referred to each other.

Figure 4:
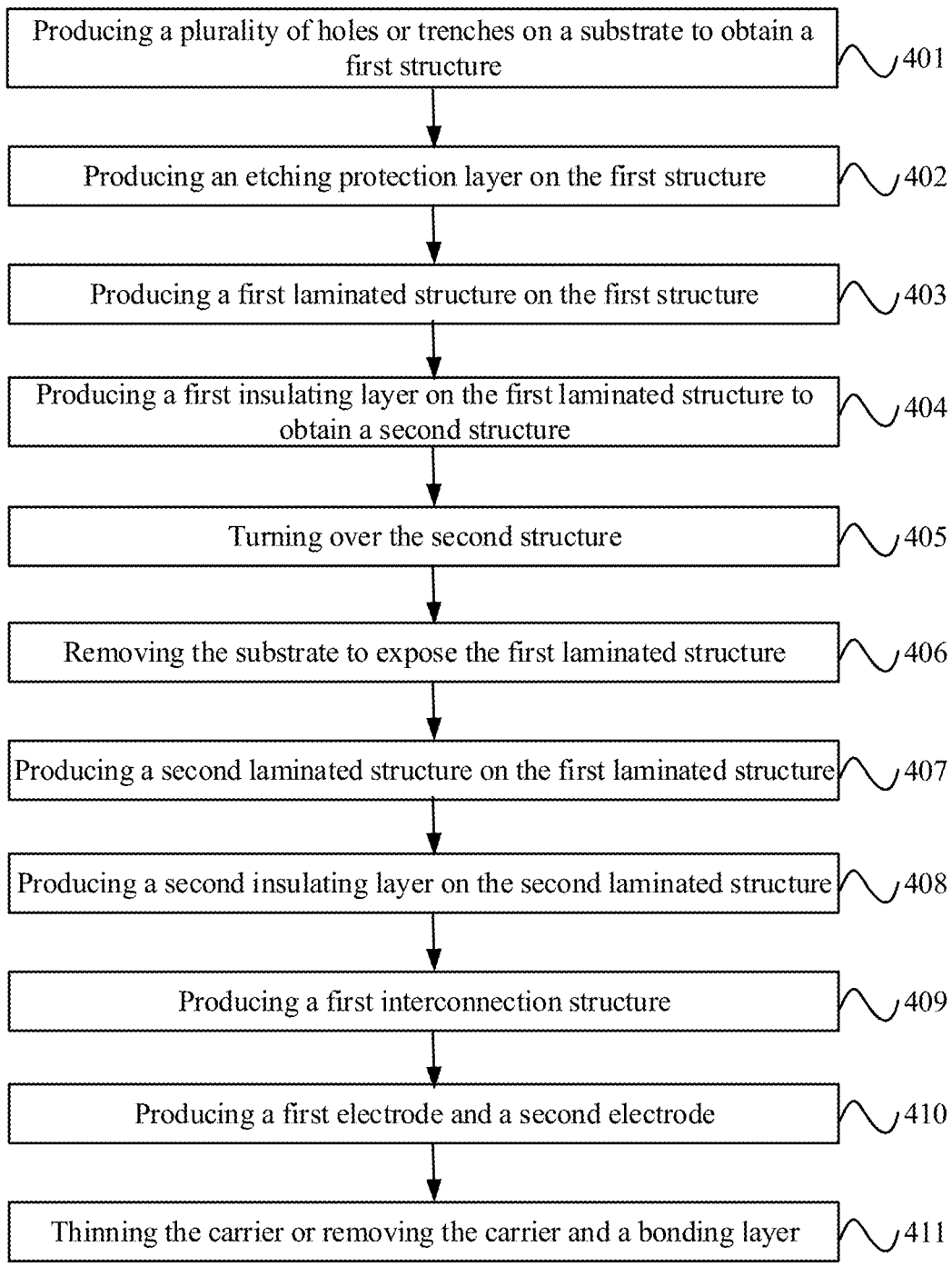
FIG. 4 is a schematic flowchart of a method for producing a capacitor according to an embodiment of the present application.

FIG. 4 illustrates a schematic flowchart of a method 400 for producing a capacitor according to an embodiment of the present application.

401, a plurality of holes or trenches are produced on a substrate to obtain a first structure.

Figure 5:
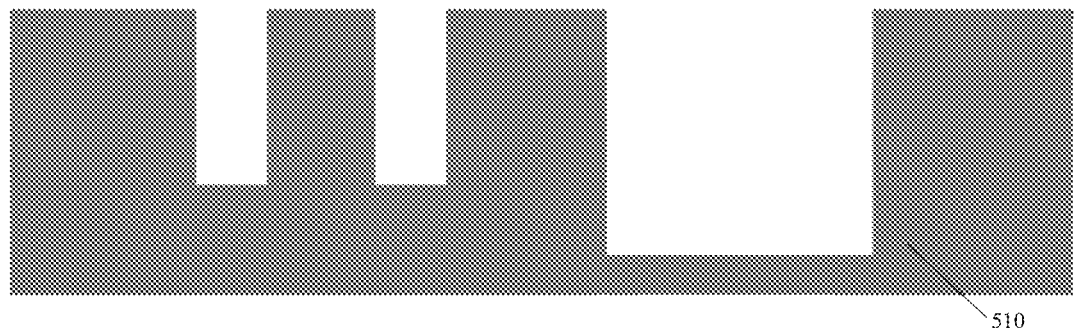
FIGS. 5-17 are schematic diagrams of production processes of a capacitor according to an embodiment of the present application.

As shown in FIG. 5, a silicon wafer is selected as a substrate 510, and on a front surface of the substrate 510, photolithography is used, for example, photoresist is coated on the wafer first, then is exposed and developed, and a plurality of holes or trenches are processed by a deep reactive ion etching (DRIE) process.

Optionally, the plurality of holes or trenches include a first hole or trench and a second hole or trench, and a size of the first hole or trench is greater than that of the second hole or trench. In other words, the plurality of holes or trenches include two sizes of holes or trenches with a large size and a small size.

Optionally, a depth-to-width ratio of the second hole or trench is greater than a predetermined threshold value.

As an example, an opening width of the first hole or trench may be 20 microns and a depth thereof may be 100 microns, and an opening width of the second hole or trench may be 2 microns and a depth thereof may be 50 microns.

The two sizes of holes or trenches may be manufactured at the same time or separately.

402, an etching protection layer is produced on the first structure.

Figure 6:
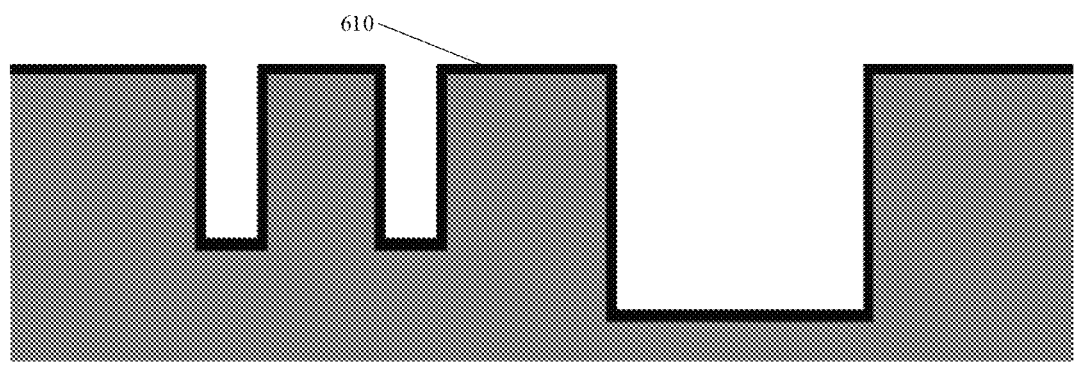

For example, as shown in FIG. 6, a layer of silicon dioxide may be grown on the surface of holes or trenches by using a thermal oxidation process, as a corrosion protection layer 610 for subsequent removal of the substrate.

403, a first laminated structure is produced on the first structure.

The first laminated structure includes m dielectric layer(s) and m+1 conductive layers, the m dielectric layer(s) and the m+1 conductive layers form a structure that a conductive layer and a dielectric layer are adjacent to each other, and m is a positive integer.

The first laminated structure may be formed by alternately depositing the conductive layers and the dielectric layers.

The conductive layer may be deposited by atomic layer deposition (ALD), physical vapor deposition (PVD), chemical vapor deposition (CVD), organometallic chemical vapor deposition, electroplating and other methods. The dielectric layer may be deposited by thermal oxidation, ALD, PVD, CVD and other methods.

Figure 7:
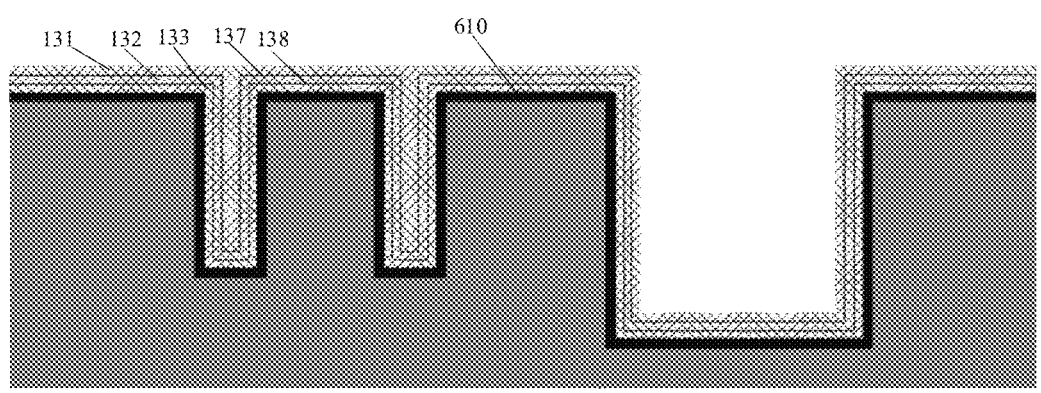

For example, as shown in FIG. 7, by using a low pressure chemical vapor deposition (LPCVD) process, a layer of heavily doped polysilicon with a thickness of 200 nm is deposited on a surface of the corrosion protection layer 610 as a conductive layer 133; by using an ALD process, a layer of aluminum oxide with a thickness of 50 nm is deposited on a surface of the conductive layer 133 as a dielectric layer 138; by using an LPCVD process, a layer of heavily doped polysilicon with a thickness of 200 nm is deposited on a surface of the dielectric layer 138 as a conductive layer 132; by using an ALD process, a layer of aluminum oxide with a thickness of 50 nm is deposited on a surface of the conductive layer 132 as a dielectric layer 137; and by using an LPCVD process, a layer of heavily doped polysilicon with a thickness of 500 nm is deposited on a surface of the dielectric layer 137 as a conductive layer 131. Finally, a structure shown in FIG. 7 is obtained. Optionally, small holes or trenches may be filled, while large holes or trenches may not be filled.

404, a first insulating layer is produced on the first laminated structure to obtain a second structure.

Figure 8:
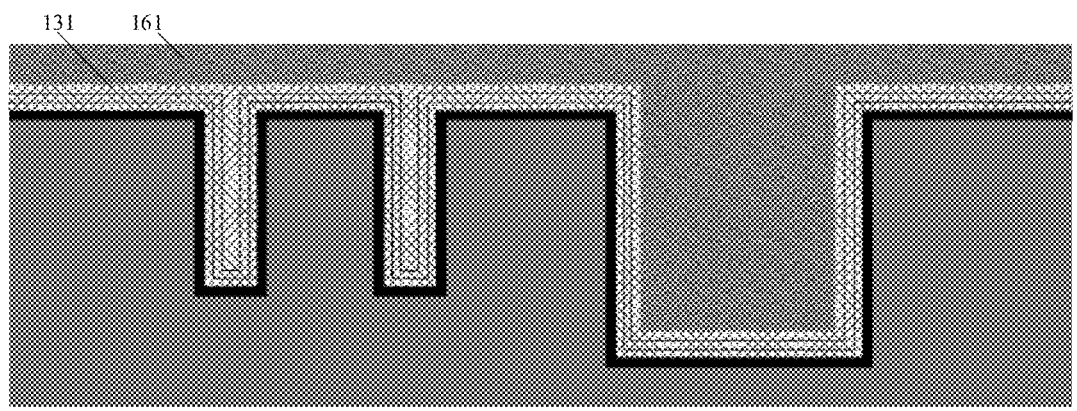

For example, as shown in FIG. 8, a thick layer of silicon dioxide may be deposited on the surface of the conductive layer 131 by using a CVD process, as a first insulating layer 161, so as to fill the large holes or trenches.

Optionally, a surface of the first insulating layer 161 may also be grinded flat. For example, by using a chemical mechanical polishing (CMP) process, the surface of the first insulating layer 161 may be grinded flat to obtain a second structure as shown in FIG. 8.

405, the second structure is turned over.

Figure 9:
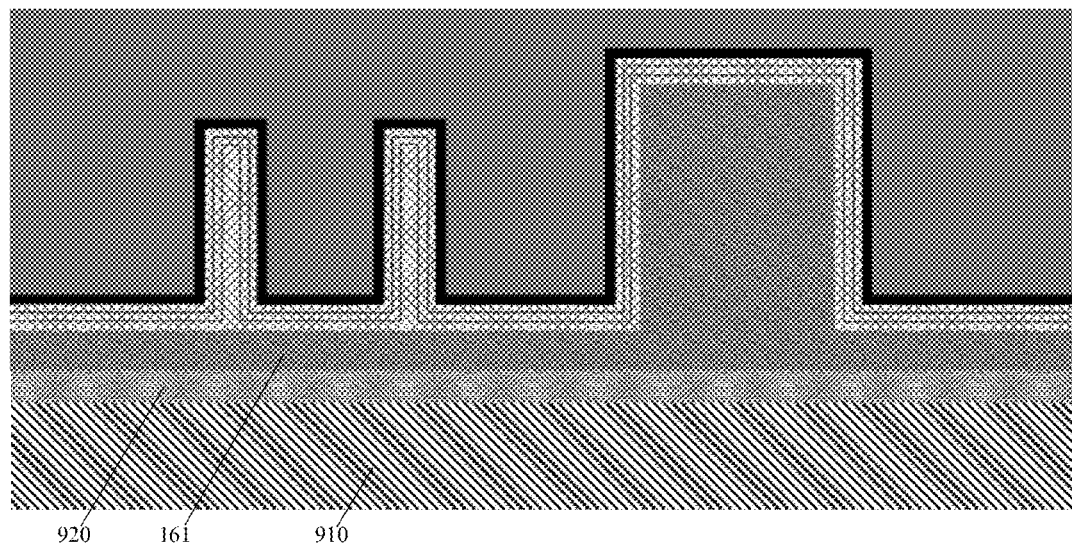

Optionally, as shown in FIG. 9, the surface of the first insulating layer 161 may also be bonded to a carrier 910, and in FIG. 9, a bonding layer 920 is between the first insulating layer 161 and the carrier 910.

For example, the surface of the first insulating layer 161 may be bonded to the carrier 910 by a bonding process, such as glass frit bonding (glass frit bonding).

406, the substrate is removed to expose the first laminated structure.

The substrate may be removed by wet etching or a combination of wet etching and dry etching.

Figure 10:
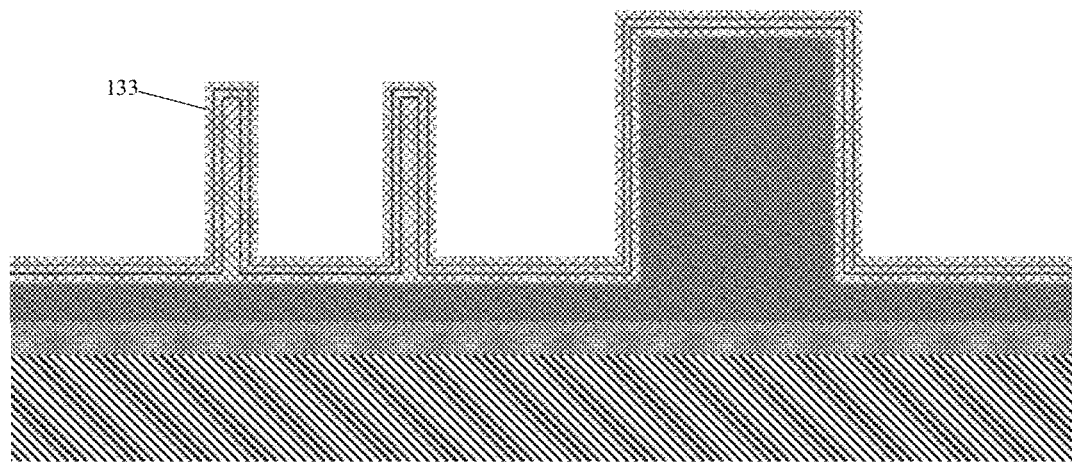

For example, the substrate may be removed with a high concentration KOH solution at 80 degrees Celsius to expose the etching protection layer; then, the etching protection layer is removed by using a hydrofluoric acid solution to expose the conductive layer 133 of the first laminated structure, as shown in FIG. 10.

407, a second laminated structure is produced on the first laminated structure.

The second laminated structure includes k dielectric layer(s) and k conductive layer(s), the k dielectric layer(s) and the k conductive layer(s) form a structure that a conductive layer and a dielectric layer are adjacent to each other and form, with the first laminated structure, a laminated structure that a conductive layer and a dielectric layer are adjacent to each other, the laminated structure forms a columnar structure at the hole or trench, and k is a positive integer.

The production manner of the second laminated structure is similar to that of the first laminated structure.

Figure 11:
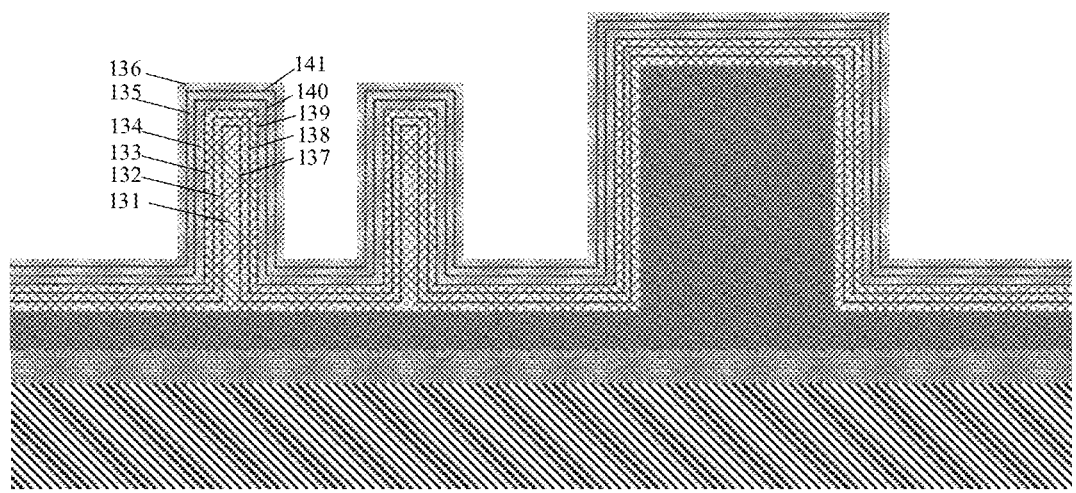

For example, as shown in FIG. 11, by using an ALD process, a layer of aluminum oxide with a thickness of 50 nm is deposited on the surface of the conductive layer 133 as a dielectric layer 139; by using an LPCVD process, a layer of heavily doped polysilicon with a thickness of 200 nm is deposited on a surface of the dielectric layer 139 as a conductive layer 134; by using an ALD process, a layer of aluminum oxide with a thickness of 50 nm is deposited on a surface of the conductive layer 134 as a dielectric layer 140; by using an LPCVD process, a layer of heavily doped polysilicon with a thickness of 200 nm is deposited on a surface of the dielectric layer 140 as a conductive layer 135; by using an ALD process, a layer of aluminum oxide with a thickness of 50 nm is deposited on a surface of the conductive layer 135 as a dielectric layer 141; and by using an LPCVD process, a layer of heavily doped polysilicon with a thickness of 200 nm is deposited on a surface of the dielectric layer 141 as a conductive layer 136. Finally, a structure shown in FIG. 11 is obtained.

408, a second insulating layer is produced on the second laminated structure.

Figure 12:
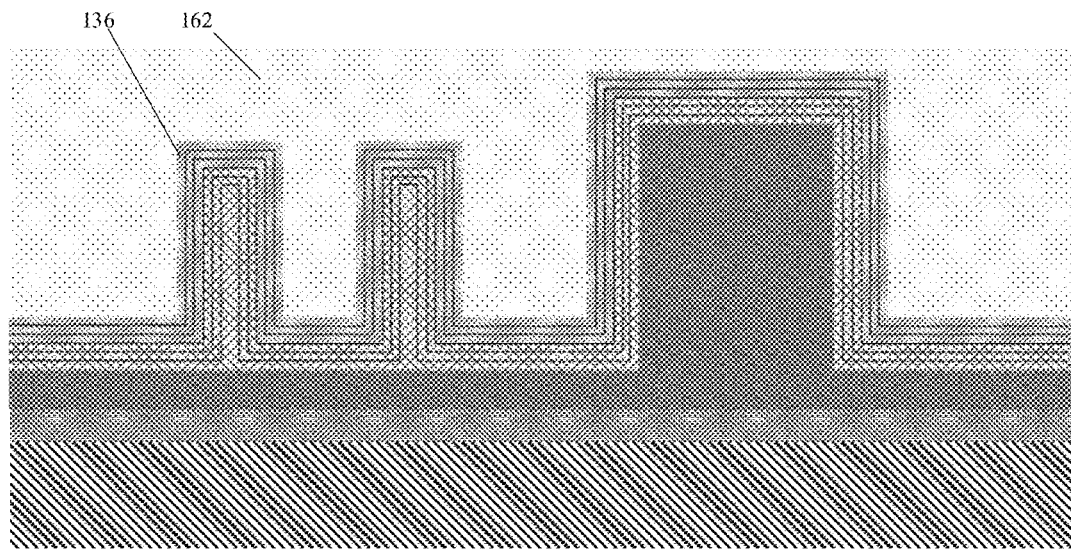

For example, as shown in FIG. 12, a thick layer of silicon dioxide may be deposited on the surface of the conductive layer 136 by using a CVD process, as a second insulating layer 162.

Optionally, a surface of the second insulating layer 162 may also be grinded flat. For example, by using a CMP process, the surface of the second insulating layer 162 may be grinded flat to obtain a structure as shown in FIG. 12.

Figure 13:
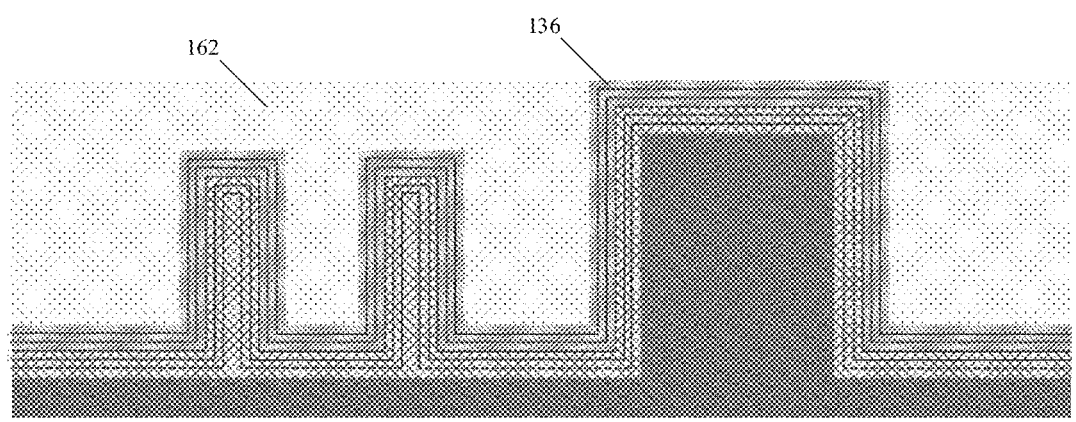

Optionally, as another embodiment, as shown in FIG. 13, the surface of the second insulating layer 162 is grinded flat until the conductive layer 136 at the uppermost of the second laminated structure is exposed. This may save subsequent etching steps and reduce cost.

409, a first interconnection structure is produced.

Optionally, the first interconnection structure may be produced using the following manner.

Figure 14:
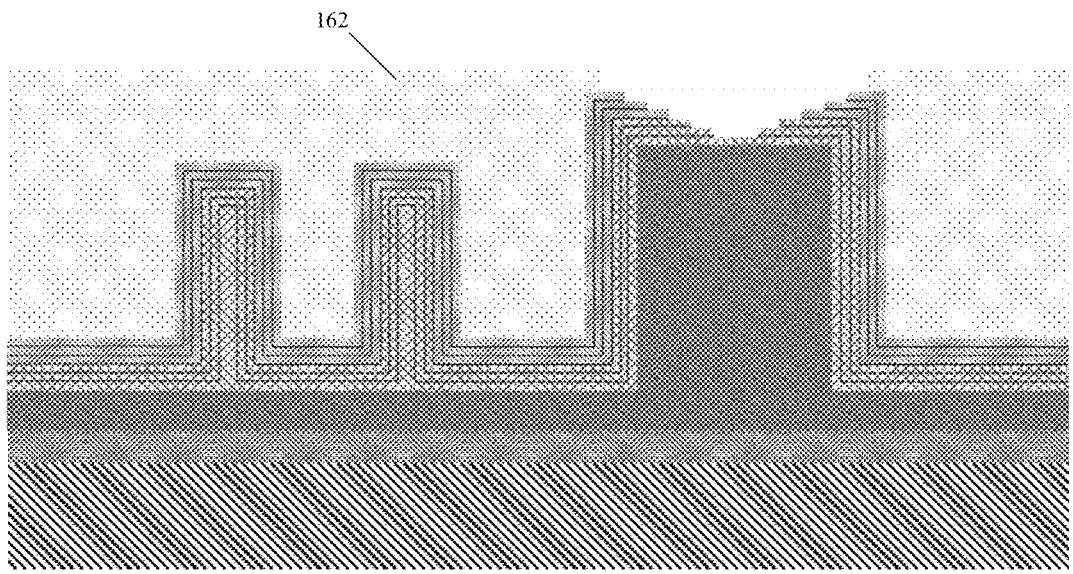

The second insulating layer 162 at the first hole or trench is etched to form a first step structure to expose the conductive layer to be connected. For example, as shown in FIG. 14, by using multiple steps of a photolithography process, a step may be formed at a position above the first hole or trench to expose respective conductive layers.

Figure 15:
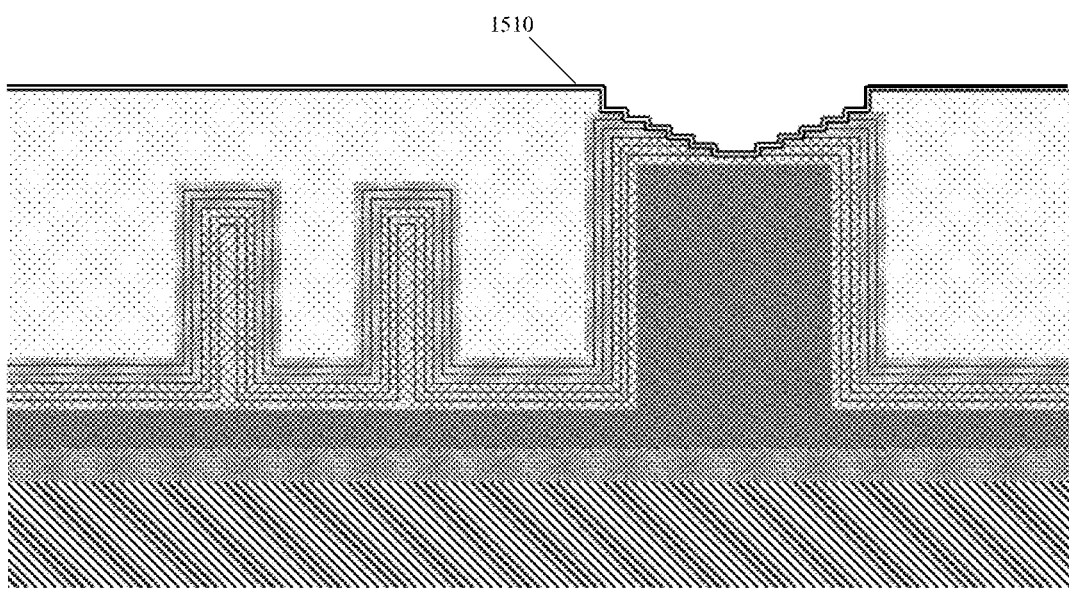

A first etching stop layer is deposited. For example, as shown in FIG. 15, a layer of silicon nitride may be deposited by using a CVD process as a first etching stop layer 1510.

A third insulating layer 163 is deposited on the first etching stop layer 1510. Etching resistance of the first etching stop layer 1510 is greater than that of the third insulating layer 163. For example, by using a CVD process, a thick layer of silicon dioxide may be deposited on the first etching stop layer 1510, as the third insulating layer 163.

For a specific conductive layer, the third insulating layer 163 is etched to obtain a hole that passes through the third insulating layer 163 until the first etching stop layer 1510 on the first step structure. For example, through holes penetrating the third insulating layer 163 may be opened at positions corresponding to each step by a photolithography process. Since a material of the first etching stop layer 1510 is more resistant to etching than that of the third insulating layer 163, the bottom of each through hole is enabled to stay on the first etching stop layer 1510 of the corresponding step.

The first etching stop layer in the hole is removed. For example, the first etching stop layer exposed at the bottom of the hole may be removed by a dry or wet process.

Figure 16:
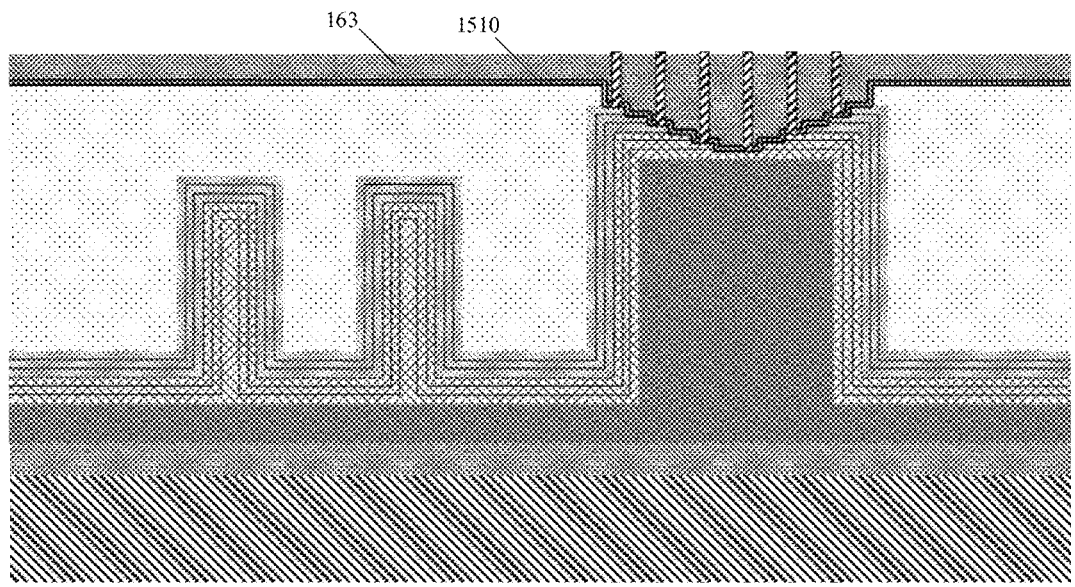

Metal is deposited in the hole to obtain a conductive through hole that passes through the third insulating layer 163 and the first etching stop layer 1510 and is connected to the specific conductive layer. For example, a layer of titanium nitride may be deposited in the hole and filled with metallic tungsten. Finally, the redundant conductive materials and insulating materials on the surface are removed by a planarization process, and a structure shown in FIG. 16 is obtained.

410, a first electrode and a second electrode are produced.

The first electrode is electrically connected to an odd-numbered conductive layer among the m+k+1 conductive layers, and the second electrode is electrically connected to an even-numbered conductive layer among the m+k+1 conductive layers.

Figure 17:
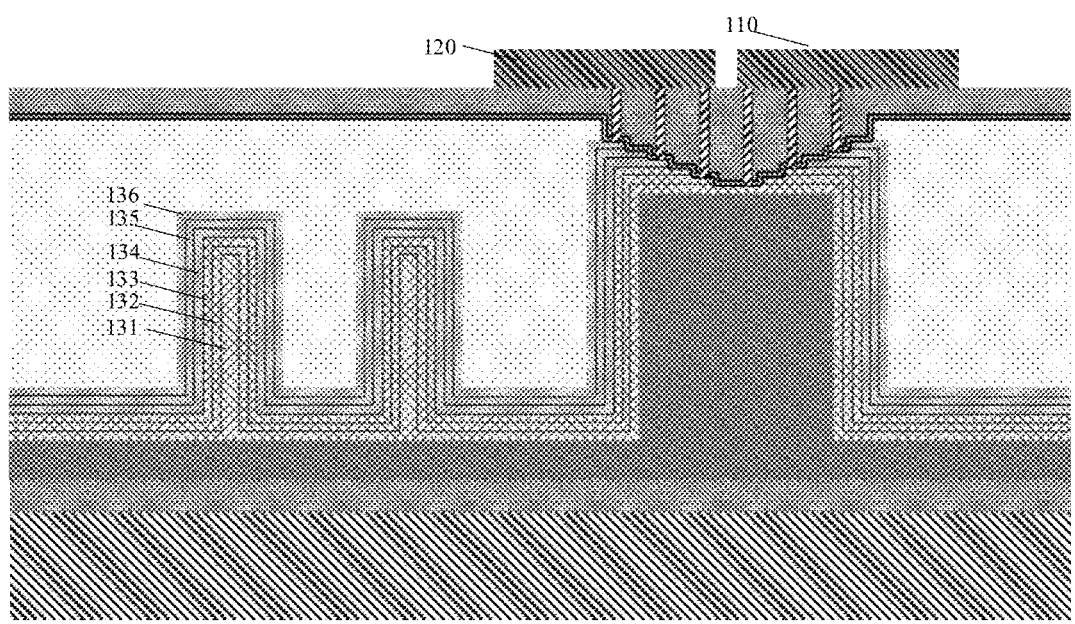

For example, as shown in FIG. 17, a layer of metallic aluminum may be deposited by a PVD process, and a first electrode 110 and a second electrode 120 may be formed by photolithography, where the first electrode 110 communicates with the conductive layer 131, the conductive layer 133 and the conductive layer 135; and the second electrode 120 communicates with the conductive layer 132, the conductive layer 134 and the conductive layer 136.

411, the carrier is thinned or the carrier and a bonding layer are removed.

The thickness of the device is reduced through this step. In one implementation, the bonding layer and the carrier may be removed, and the capacitor shown in FIG. 1 may be obtained after removing the bonding layer and the carrier. In another implementation, when the carrier and the bonding layer cannot be removed, the carrier may be thinned.

In the foregoing embodiments, the capacitor shown in FIG. 1 may be obtained by producing the first interconnection structure including the conductive through holes respectively connected to all conductive layers. In this case, the first electrode 110 is electrically connected to the odd-numbered conductive layer through the first interconnection structure, and the second electrode 120 is electrically connected to the even-numbered conductive layer through the first interconnection structure.

Optionally, the capacitor shown in FIG. 2 may be obtained by producing, on both sides of the laminated structure, the first interconnection structure and the second interconnection structure including the conductive through holes respectively connected to part of the conductive layers.

Specifically, the second interconnection structure may be produced after the first laminated structure is produced.

Optionally, the second interconnection structure may be produced using the following manner. It should be understood that, in addition to the following description, other details may refer to the production manner of the first interconnection structure.

Before producing the first insulating layer 161, the first laminated structure is etched to form a second step structure to expose the conductive layer to be connected.

A second etching stop layer 1520 is deposited.

Etching resistance of the second etching stop layer 1520 is greater than that of the first insulating layer 161.

After producing the first insulating layer 161, for a specific conductive layer, the first insulating layer 161 is etched to obtain a hole that passes through the first insulating layer 161 until the second etching stop layer 1520 on the second step structure.

The second etching stop layer in the hole is removed.

Metal is deposited in the hole to obtain a conductive through hole that passes through the first insulating layer 161 and the second etching stop layer 1520 and is connected to the specific conductive layer, and metal interconnection among the conductive layers to be connected is formed.

Optionally, after producing the second interconnect structure, a fourth insulating layer 164 may also be produced on the second interconnection structure.

In this embodiment, both the first interconnection structure and the second interconnection structure include the conductive through holes respectively connected to part of the conductive layers; the first electrode 110 is electrically connected to the odd-numbered conductive layer through the first interconnection structure and the second interconnection structure, and the second electrode 120 is electrically connected to the even-numbered conductive layer through the first interconnection structure.

In this way, a plurality of capacitors may be produced on one wafer, and then independent capacitors may be obtained by cutting.

According to the method for producing the capacitor provided by the embodiments of the present application, a laminated structure including a larger number of conductive layers and dielectric layers may be obtained by producing the laminated structure twice and a capacitance value of the capacitor is increased, and a plurality of holes or trenches are utilized to form a plurality of columnar structures of the laminated structure, which may further increase the capacitance value of the capacitor, thereby improving capacitance density of the capacitor.

It should be noted that specific examples in embodiments of the present application are just intended to help a person skilled in the art better understand the embodiments of the present application, rather than for limiting the scope of the present application.

It should also be noted that terms used in embodiments of the present application and the claims appended hereto are merely for the purpose of describing particular embodiments, and are not intended to limit the embodiments of the present application. For example, the use of a singular form of "a", "the" and "said" in the embodiment of the present application and the claims appended hereto are also intended to include a plural form, unless otherwise clearly indicated herein by context.

The foregoing description is only a specific implementation manner of the present application. The protection scope of the present application, however, is not limited here. Various modifications or replacements may be readily conceivable to any person skilled in the art within the technical scope disclosed in the present application, and such modifications or replacements shall fall within the protection scope of the present application. Therefore, the protection scope of this application shall be subject to the protection scope of the claims.

What is claimed is:

1. A capacitor, comprising:
    an electrode layer comprising a first electrode and a second electrode separated from each other;
    a laminated structure comprising n dielectric layers and n+1 conductive layers, wherein the n dielectric layers and the n+1 conductive layers form a structure that a conductive layer and a dielectric layer are adjacent to each other, and the laminated structure forms at least two columnar structures, and n is a positive integer; and
    an interconnection structure configured to electrically connect an odd-numbered conductive layer in the n+1 conductive layers to the first electrode and electrically connect an even-numbered conductive layer in the n+1 conductive layers to the second electrode;
    wherein the interconnection structure is connected to the n+1 conductive layers at a top end of the first columnar structure and under the laminated structure.

2. The capacitor according to claim 1, wherein the at least two columnar structures comprise at least one first columnar structure and at least one second columnar structure, wherein a size of the first columnar structure is greater than that of the second columnar structure.

3. The capacitor according to claim 2, wherein the at least two columnar structures comprise one first columnar structure and at least two second columnar structures.

4. The capacitor according to claim 1, wherein the laminated structure is provided with a step structure, and the interconnection structure is connected to the n+1 conductive layers through the step structure.

5. The capacitor according to claim 1, wherein the columnar structure is a rectangular parallelepiped structure or a cylindrical structure.

6. The capacitor according to claim 1, wherein the capacitor further comprises:
    an insulating layer disposed above and below the laminated structure.

7. The capacitor according to claim 6, wherein the interconnection structure is a conductive through hole that passes through the insulating layer and is respectively connected to the n+1 conductive layers.

8. The capacitor according to claim 1, wherein n is greater than or equal to 5.

9. A method for producing a capacitor, comprising:
producing a plurality of holes or trenches on a substrate to obtain a first structure;
producing a first laminated structure on the first structure, wherein the first laminated structure comprises m dielectric layers and m+1 conductive layers, the m dielectric layers and the m+1 conductive layers form a structure that a conductive layer and a dielectric layer are adjacent to each other, and m is a positive integer;
producing a first insulating layer on the first laminated structure to obtain a second structure;
turning over the second structure;
removing the substrate to expose the first laminated structure;
producing a second laminated structure on the first laminated structure, wherein the second laminated structure comprises k dielectric layers and k conductive layers, the k dielectric layers and the k conductive layers form a structure that a conductive layer and a dielectric layer are adjacent to each other and form, with the first laminated structure, a laminated structure that a conductive layer and a dielectric layer are adjacent to each other, the laminated structure forms a columnar structure at the hole or trench, and k is a positive integer;
producing a second insulating layer on the second laminated structure; and
producing a first electrode and a second electrode, wherein the first electrode is electrically connected to an odd-numbered conductive layer among the m+k+1 conductive layers, and the second electrode is electrically connected to an even-numbered conductive layer among the m+k+1 conductive layers.

10. The method according to claim 9, wherein the plurality of holes or trenches comprise a first hole or trench and a second hole or trench, and a size of the first hole or trench is greater than that of the second hole or trench.

11. The method according to claim 9, wherein before the producing the first laminated structure on the first structure, the method further comprises:
producing an etching protection layer on the first structure;
wherein the removing the substrate to expose the first laminated structure comprises:
removing the substrate to expose the etching protection layer, and then removing the etching protection layer to expose the first laminated structure.

12. The method according to claim 9, wherein before the turning over the second structure, the method further comprises:
grinding a surface of the first insulating layer flat; and
wherein after the turning over the second structure, the method further comprises: bonding the surface of the first insulating layer to a carrier; and
wherein after the producing the first electrode and the second electrode, the method further comprises:
thinning the carrier or removing the carrier and a bonding layer.

13. The method according to claim 9, wherein after the producing the second insulating layer on the second laminated structure, the method further comprises:
grinding a surface of the second insulating layer flat, until the conductive layer at the uppermost of the second laminated structure is exposed.

14. The method according to claim 9, wherein before the producing the first electrode and the second electrode, the method further comprises:
producing a first interconnection structure, wherein the first interconnection structure comprises a conductive through hole respectively connected to all of the conductive layers, the first electrode is electrically connected to the odd-numbered conductive layer through the first interconnection structure, and the second electrode is electrically connected to the even-numbered conductive layer through the first interconnection structure.

15. The method according to claim 9, wherein before the producing the first electrode and the second electrode, the method further comprises:
producing a first interconnection structure, wherein the first interconnection structure comprises a conductive through hole respectively connected to part of the conductive layers;
producing a second interconnection structure after the producing the first laminated structure on the first structure;
wherein the first electrode is electrically connected to the odd-numbered conductive layer through the first interconnection structure and the second interconnection structure, and the second electrode is electrically connected to the even-numbered conductive layer through the first interconnection structure.

16. The method according to claim 15, wherein the producing the first interconnection structure comprises:
etching the second insulating layer at the first hole or trench to form a first step structure to expose the conductive layer to be connected;
depositing a first etching stop layer;
depositing a third insulating layer on the first etching stop layer, wherein etching resistance of the first etching stop layer is greater than that of the third insulating layer;
for a specific conductive layer, etching the third insulating layer to obtain a hole that passes through the third insulating layer until the first etching stop layer on the first step structure;
removing the first etching stop layer in the hole; and
depositing metal in the hole to obtain a conductive through hole that passes through the third insulating layer and the first etching stop layer and is connected to the specific conductive layer.

17. The method according to claim 16, wherein the producing the second interconnection structure comprises:
before the producing the first insulating layer on the first laminated structure, etching the first laminated structure to form a second step structure to expose the conductive layer to be connected;
depositing a second etching stop layer, wherein etching resistance of the second etching stop layer is greater than that of the first insulating layer;
after the producing the first insulating layer on the first laminated structure, for a specific conductive layer, etching the first insulating layer to obtain a hole that passes through the first insulating layer until the second etching stop layer on the second step structure;
removing the second etching stop layer in the hole; and
depositing metal in the hole to obtain a conductive through hole that passes through the first insulating layer and the second etching stop layer and is connected to the specific conductive layer, and forming metal interconnection among the conductive layers to be connected.

18. The method according to claim 16, wherein after the producing the second interconnection structure, the method further comprises:
   producing a fourth insulating layer on the second interconnection structure.

* * * * *